United States Patent
Liu

(10) Patent No.: US 12,211,545 B2
(45) Date of Patent: Jan. 28, 2025

(54) INPUT BUFFER BIAS CURRENT CONTROL

(71) Applicant: Micron Technology, Inc., Boise, ID (US)

(72) Inventor: Liang Liu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 148 days.

(21) Appl. No.: 17/845,640

(22) Filed: Jun. 21, 2022

(65) Prior Publication Data

US 2023/0410888 A1  Dec. 21, 2023

(51) Int. Cl.
*G11C 11/4093* (2006.01)
(52) U.S. Cl.
CPC .................. *G11C 11/4093* (2013.01)
(58) Field of Classification Search
CPC .................................................. G11C 11/4093
USPC ..................................................... 365/189.5
See application file for complete search history.

(56) References Cited

U.S. PATENT DOCUMENTS

2022/0122678 A1* 4/2022 Kim ................. G11C 16/30
2022/0148632 A1* 5/2022 Kim ................. G11C 16/26

* cited by examiner

*Primary Examiner* — Anthan Tran
(74) *Attorney, Agent, or Firm* — Fletcher Yoder, P.C.

(57) ABSTRACT

Devices and methods include generating biases for input buffers of a semiconductor device. In some embodiments, the semiconductor device includes an input buffer that buffer datas and biasing generation and distribution circuitry that generates and distributes a bias current to the input buffer based at least in part on a reference voltage. The biasing generation and distribution circuitry includes dynamic voltage bias circuitry that adjusts the bias current and reference voltage tracking circuitry that controls operation of the dynamic voltage bias circuitry based on the reference voltage.

20 Claims, 5 Drawing Sheets

INPUT BUFFER BIAS CURRENT CONTROL

BACKGROUND

Field of the Present Disclosure

Embodiments of the present disclosure relate generally to semiconductor devices. More specifically, embodiments of the present disclosure relate to controlling bias current for an input buffer of a semiconductor device.

Description of Related Art

Generally, a computing system may include electronic devices that, in operation, communicate information via electrical signals. For example, a computing system may include a processor communicatively coupled to a memory device, such as a dynamic random-access memory (DRAM) device implemented on dual in-line memory module (DIMM). In this manner, the processor may communicate with the memory device, for example, to retrieve executable instructions, retrieve data to be processed by the processor, and/or store data output from the processor.

Semiconductor devices (e.g., memory devices) may utilize input buffers. For instance, DRAM devices may use input buffers that use biasing to control how the input buffer and/or the input buffer channel behaves and to aid in memory operations for the DRAM devices. For example, a bias current and/or voltage may be used to bias circuitry (e.g., transistors) in the input buffer and/or input buffer channel. A reference voltage may be tracked to control generation of the bias current and/or voltage. In some instances, the reference voltage magnitude may vary during operation of the semiconductor device. Accordingly, the circuitry in the input buffer and/or input buffer channel may not operate consistently across variations in the reference voltage magnitude. Additionally, the reference voltage magnitude may vary due to variations in process, voltage, temperature (PVT) conditions for the semiconductor device. For example, different process corners may result in different threshold voltages for circuitry in the input buffer and/or input buffer channel. Accordingly, the circuitry in the input buffer and/or input buffer channel may not operate consistently across PVT variations.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices exchange data and store the data in memory banks using input buffers. These input buffers and/or their corresponding channels are biased to cause the input buffers and/or their corresponding channels to behave in a consistent and intended manner. The biasing circuitry may include input buffer biasing generation and distribution circuitry that generates and distributes biasing current to the input buffers. Variations in reference voltage for the input buffers may result in inconsistent operations. Additionally, different process corners may result in different threshold voltages for circuitry in the input buffer and/or input buffer channel. Accordingly, the circuitry in the input buffer and/or input buffer channel may not operate consistently across PVT variations. The input buffer biasing generation and distribution circuitry may adjust a bias current based on the process corner of the semiconductor device. Accordingly, the input buffer biasing generation and distribution circuitry may facilitate improved input buffer operations by providing consistent operation across variations in reference voltage and process corners.

Figure 1:
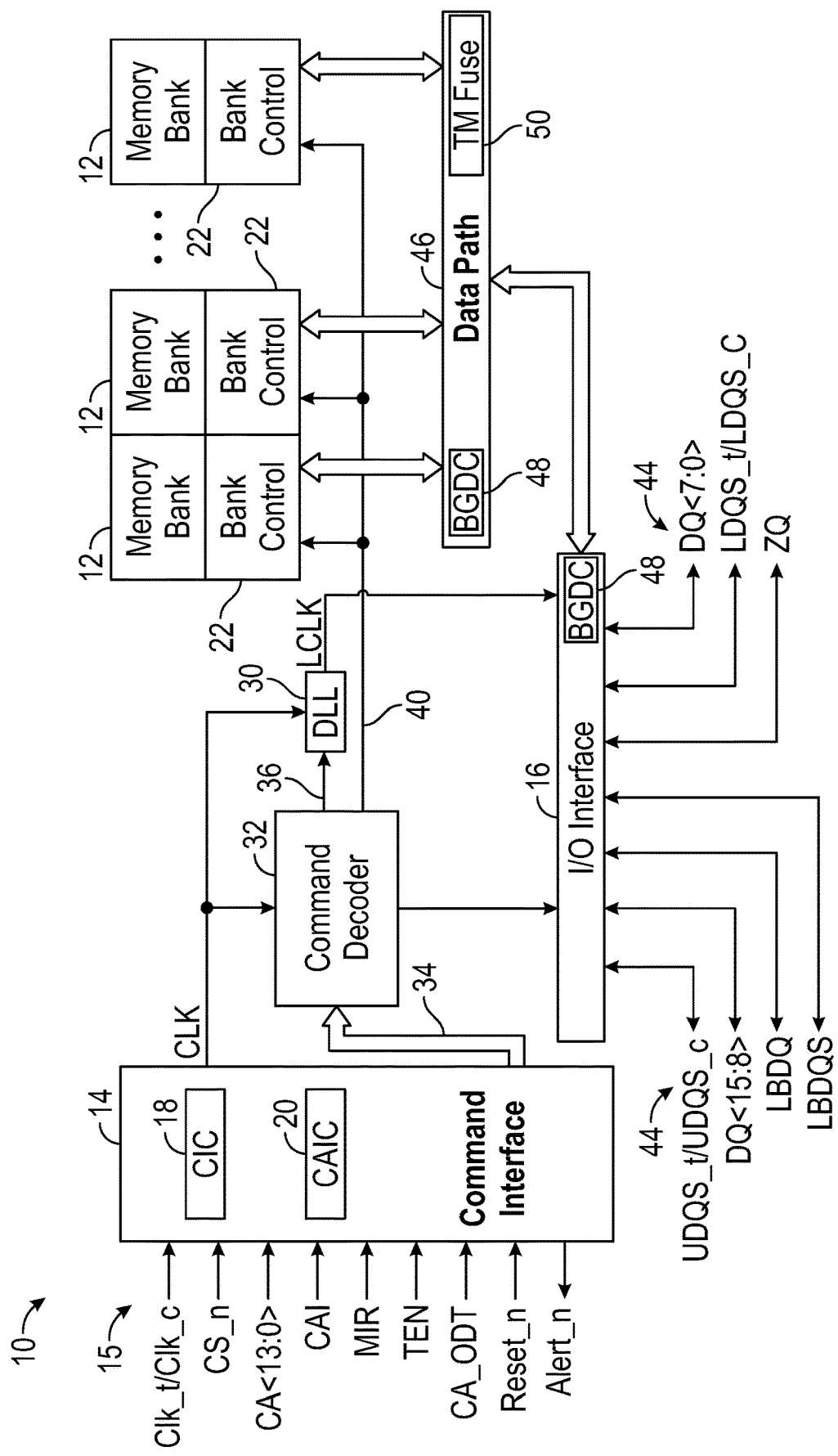
FIG. 1 is a simplified block diagram illustrating certain features of a memory device having bias generation and distribution circuitry, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, the true clock signal Clk_t and the bar/complementary clock signal Clk_c. The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal Clk_t and the complementary clock signal Clk_c and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/ address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command)

or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/ VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

The memory device 10 may include biasing generation and distribution circuitry 48 that generates and distributes a biasing current and/or a current for use in biasing input buffers for the memory device 10. The biasing generation and distribution circuitry 48 may be included in the input/ output (I/O) interface 16 and/or the datapath 46. The memory device 10 may also include a test mode fuse 50 that may include a resistive element (e.g., resistor). The test mode fuse may be utilized to provide a signal to the biasing generation and distribution circuitry 48 to adjust the biasing current based on an identified process corner. In some embodiments, other electrical components may be used in addition or alternative to using a fuse. For instance, a control signal may be generated based on a mode register, software instructions, and/or using any other suitable techniques. Any suitable electrical component may store an indication associated with the control signal based at least in part on the identified process corner. For example, circuitry of the memory device 10 may store an indication (e.g., bit code, bit, value) that may be utilized to adjust a bias current.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
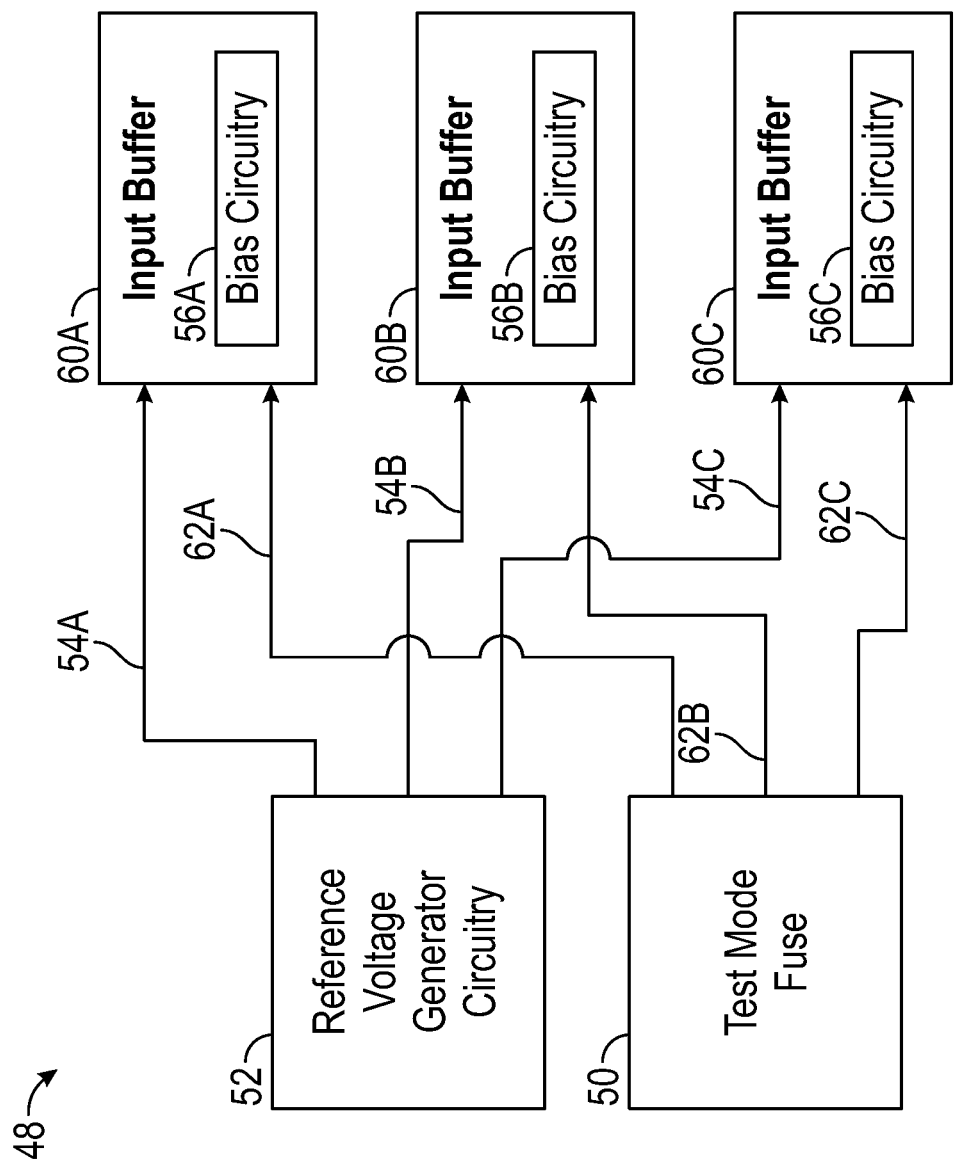
FIG. 2 is a block diagram of bias generation and distribution circuitry, according to an embodiment of the present disclosure.

Turning now to FIG. 2, FIG. 2 illustrates an embodiment of the bias generation and distribution circuitry 48. As illustrated, the bias generation and distribution circuitry 48 includes reference voltage generator circuitry 52 that generates a reference voltage 54 (referred to individually as reference voltages 54A, 54B, 54C). The reference voltage 54 is provided to bias circuitry 56 (referred to individually as bias circuitries 56A, 56B, 56C) that provides one or more biases to input buffers 60 (referred to individually as input buffers 60A, 60B, 60C) based at least in part on the reference voltage 54. The biases may include bias voltages and/or bias currents. The biases cause the input buffers 60 to function as intended. For example, the biases may be used to bias circuitry (e.g., a transistor) in the input buffers 60 and/or an input buffer channel during a write command used to write data to the memory banks 12. Additionally or alternatively, the test mode fuse 50 may provide a control signal 62 (referred to individually as control signals 62A, 62B, 62C) to bias circuitry 56 based on an identified process corner. For example, a test operation may be performed on a semiconductor device (e.g., memory device 10) after manufacture. The test operation may analyze performance of one or more of the input buffers 60 and may identify a process corner based on the analyzed performance. In some embodiments, once a process corner is identified, the test mode fuse 50 may be set, and the control signal 62 may be generated and provided to the bias circuitry 56 for generation of the biases. For example, at slow corners, a threshold voltage may be high (e.g., about 0.8 volts, 0.9 volts, 1 volt), and the reference voltage 54 may be at an inadequate level for generation of the biases. The control signal 62 may be used to adjust operation of the bias circuitry 56 and, as such, adjust the biases. For example, the control signal 62 may operate one or more transistors of the bias circuitry 56 to adjust the biases. Additionally or alternatively, the control signal 62 may be generated based at least in part on an indication stored in circuitry of a semiconductor device.

Figure 3:
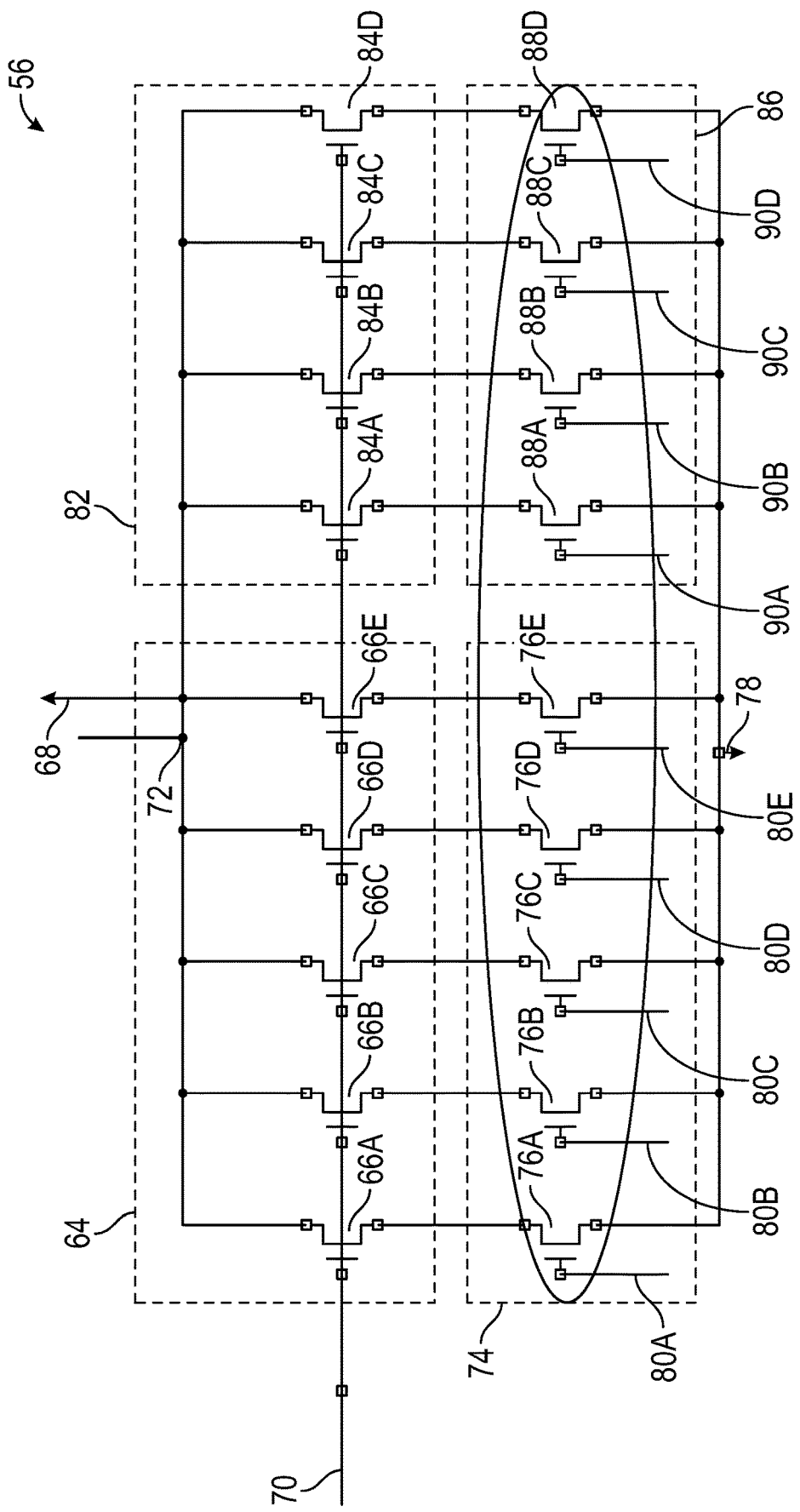
FIG. 3 is a circuit diagram of bias circuitry of the bias generation and distribution circuitry of FIG. 2, according to an embodiment of the present disclosure.

FIG. 3 is a circuit diagram of an embodiment of the bias circuitry 56 of the bias generation and distribution circuitry 48 of FIG. 2. As illustrated, the bias circuitry 56 may include dynamic voltage bias circuitry 64. The dynamic voltage bias circuitry 64 may include transistors 66 (referred to individually as transistors 66A, 66B, 66C, 66D, 66E) that generate the biases (e.g., bias current 68). In certain embodiments, the transistors 66 may include one or more N-channel metal oxide semiconductor (NMOS) transistors. Gate terminals of the transistors 66 may be coupled (e.g., shorted) to a feedback line 70. The feedback line 70 may be coupled to one or more resistors. Source terminals of the transistors 66 may be coupled to drain terminals of transistors 76. Drain terminals of the transistors 66 may be coupled to a common node 72 that provides the bias current 68 to the input buffers 60. Operation of the transistors 66 may be adjusted to adjust the bias current 68 (e.g., increase, decrease) based on the reference voltage 54.

The bias circuitry 56 may also include reference voltage tracking circuitry 74 that may adjust operation of one or more of the transistors 66 based at least in part on the reference voltage 54. The reference voltage tracking circuitry 74 may include transistors 76 (referred to individually as transistors 76A, 76B, 76C, 76D, 76E). In certain embodiments, the transistors 76 may include one or more NMOS transistors. Source terminals of the transistors 76 may be coupled to ground 78. Gate terminals of the transistors 76 may be coupled to signal lines 80 (referred to individually as signal lines 80A, 80B, 80C, 80D, 80E). The signal lines 80 may control operation of the transistors 76 based at least in part on the reference voltage 54. For example, the memory device may generate one or more control signals for the signal lines 80 that may be provided to the gate terminals of the transistors 76. The drain terminals of the transistors 76 may be coupled to the source terminals of the transistors 66. The memory device 10 may generate control signals based on a voltage level (e.g., magnitude) of the reference voltage 54. For example, the memory device 10 may generate control signals to turn on one or more of the transistors 76. When turned on, the transistors 76 may pull down charge to ground 78, thereby increasing the bias current 68. The memory device 10 may generate the control signals to ensure consistent operation of the input buffers 60 in response to variations in the reference voltage 54. For instance, based on a reference voltage level, a corresponding code (e.g., 1, 2, 3, 4, 5, or more bit code) may be transmitted to respective transistors 76 for the number of bits (e.g., 5 in the illustrated embodiment) in the code. The amount of transistors 76 that have assertions at their respective gate terminals impacts the magnitude of the bias current 68 as a mechanism of tracking the reference voltage. Specifically, the transistors 76 that are closed switches may bleed off charge with lower bias current 68 levels for higher reference voltage levels. As such, the reference voltage tracking circuitry 74 may adjust the bias current 68 by controlling operation of the dynamic voltage bias circuitry 64 based on the reference voltage 54.

The bias circuitry 56 may include process bias circuitry 82. The process bias circuitry 82 may include transistors 84 (referred to individually as transistors 84A, 84B, 84C, 84D) that assist in generating the biases (e.g., the bias current 68). Gate terminals of the transistors 84 may be coupled to the feedback line 70. Source terminals of the transistors 84 may be coupled to drain terminals of transistors 88. Drain terminals of the transistors 84 may be coupled to the common node 72.

The bias circuitry 56 may also include process adjustment circuitry 86 that may adjust operation of one or more of the transistors 84 based at least in part on an identified process corner of the memory device 10. For example, a test operation may be performed on an input buffer to identify a process corner associated with the memory device 10. Based on results of the test operation, one or more fuses (e.g., test mode fuse 50) may be adjusted (e.g., melted) and the memory device 10 may generate a control signal (e.g., the control signal 62) to operate the process adjustment circuitry 86 based at least in part on the identified process corner. The memory device may analyze a resistance of the fuses to determine an operational status (e.g., melted, intact) of the fuses. For example, a melted fuse may operate as an open circuit and may provide an indication of near infinite resistance. As such, the memory device 10 may determine whether resistance of the fuses exceeds a threshold resistance to determine the operational status. Based on the operational status of the fuses, the memory device 10 may generate a code value to control operation of one or more components of the process adjustment circuitry 86. In some embodiments, the fuses may be permanently fixed based on the results of the test operation. For example, a fuse may not be further adjusted once melted.

The process adjustment circuitry 86 may include one or more transistors 88 (referred to individually as transistors 88A, 88B, 88C, 88D) that may be controlled by corresponding control signals via control lines 90 (referred to individually as control lines 90A, 90B, 90C, 90D). Source terminals of the transistors 88 may be coupled to ground 78. Drain terminals of the transistors 88 may be coupled to source terminals of the transistors 84. Gate terminals of the transistors 88 may be coupled to the control lines 90 and may receive the control signals via the control lines 90. Each control line 90 may provide a corresponding control signal based on a code value generated by the memory device 10. Each bit in the code value may correspond to a particular control line 90. For example, at slow corners, the memory device 10 may generate a code value to turn on the transistors 88 (e.g., 1111). As such, the control signals provided by the control lines 90 may be high (e.g., 1) to turn on the transistors 88. Accordingly, the transistors 88 may pull down charge to ground 78 and, as such, increase the bias current 68. For instance, based on an identified process corner, a corresponding code (e.g., 1, 2, 3, 4, 5, or more bit code) may be transmitted to respective transistors 88 for the number of bits (e.g., 4 in the illustrated embodiment) in the code. The amount of transistors 88 that have assertions at their respective gate terminals impacts the magnitude of the bias current 68 as a mechanism of tracking an identified process corner. Specifically, the transistors 88 that are closed switches may bleed off charge with lower bias current 68 levels for slow process corners.

As another example, at fast corners, the memory device 10 may generate a code value to turn off the transistors 88 (e.g., 0000). As such, the control signals provided by the control lines may be low (e.g., 0) to turn off the transistors 88 and decrease the bias current 68. Additionally, at typical corners, the memory device 10 may generate a code value to turn off a first subset of the transistors 88 and turn on a second subset of the transistors 88. As such, the process adjustment circuitry 86 may adjust the bias current 68 by controlling operation of the process bias circuitry 82 based on identified process corners.

Although the transistors 76 are illustrated all as having the same size, some embodiments may have differently sized transistors to enable more bleed off for one bit of the code for the control signals from one or more signal lines 80 than another bit in the code. Likewise, the transistors 88 may have differently sized transistors to enable more bleed off for one bit of the code for the control signals from one or more control lines 90 than another bit in the code.

Figure 4:
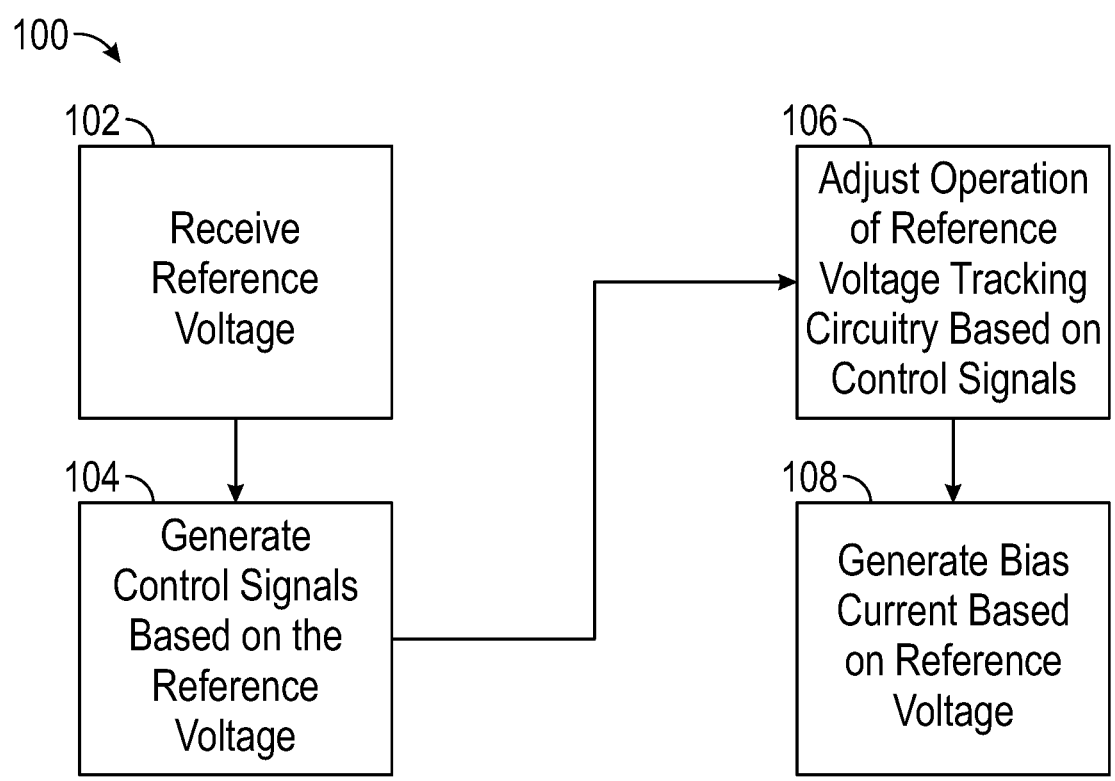
FIG. 4 is a flowchart of a process for bias current generation using reference voltage tracking circuitry, according to an embodiment of the present disclosure.

With the foregoing in mind, FIG. 4 illustrates a flowchart of a process 100 for bias current generation using the bias circuitry 56 of FIG. 3, according to an embodiment of the present disclosure. The process 100 may be implemented by the memory device 10. At block 102, the memory device 10 may receive the reference voltage from the reference voltage generator circuitry 52. The memory device may generate (block 104) control signals based on the reference voltage and may transmit the control signals to the bias circuitry 56. For example, this generation may be performed using lookup tables or outputting a value corresponding to a current bias level. The bias circuitry 56 may receive the control signals and the reference voltage 54 and may generate the biases based on the reference voltage.

At block 106, the bias circuitry 56 may adjust operation of the reference voltage tracking circuitry 74 based on the control signals. For example, the bias circuitry 56 may adjust operation of one or more transistors 76 based on control signals from one or more signal lines 80. The bias circuitry 56 may turn on a first subset (e.g., one, two, all) of the transistors 76 and/or may turn off a second subset (e.g., one, two, all) of the transistors 76 based on the control signals. At block 108, the bias circuitry 56 may generate the bias current 68 based on the reference voltage and the operation of the reference voltage tracking circuitry 74. For example, one or more of the transistors 76 may pull down charge to ground 78 and increase the bias current 68 based on the reference voltage 54.

Figure 5:
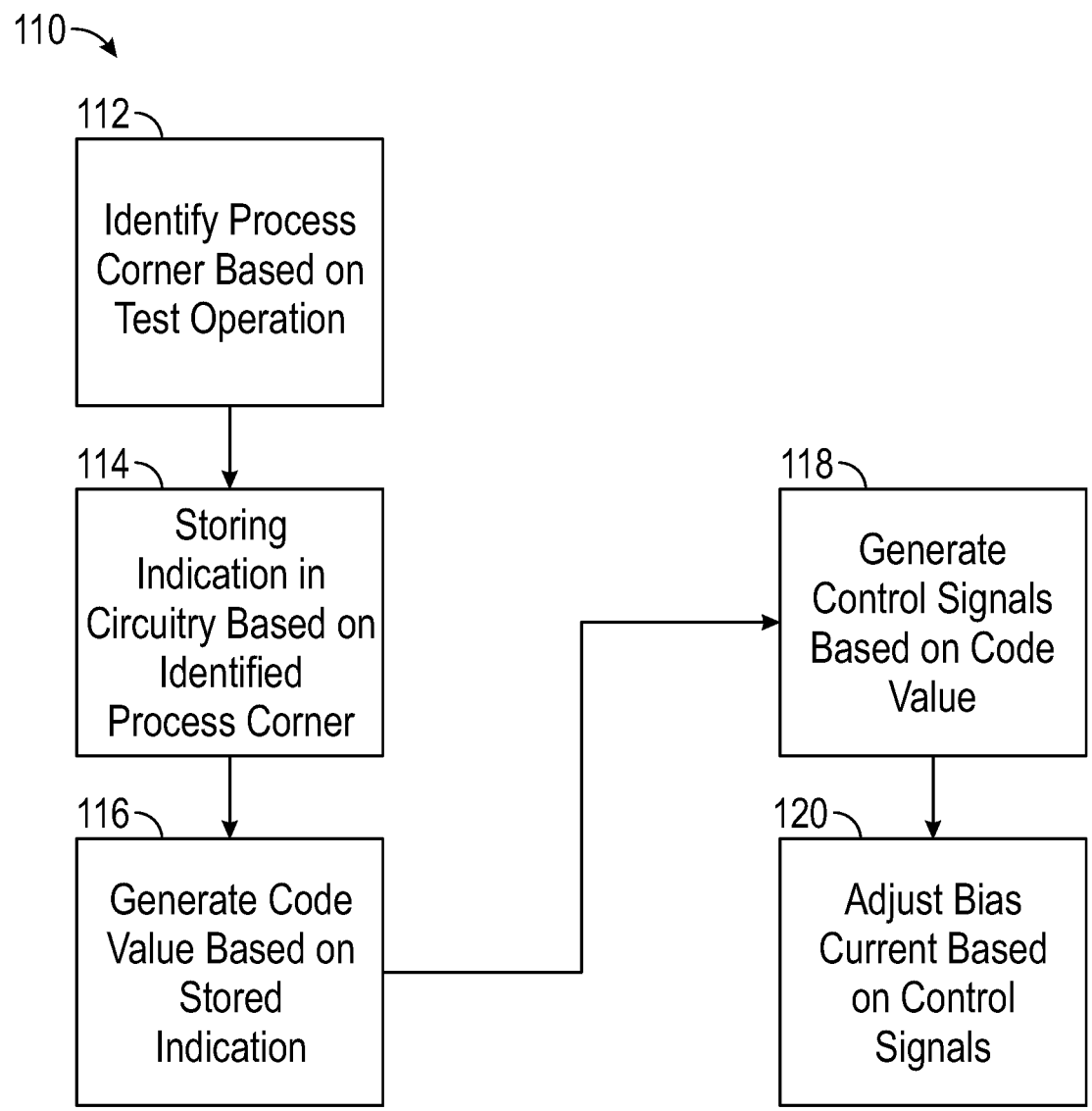
FIG. 5 is a flowchart of a process for bias current generation based on process corners, according to an embodiment of the present disclosure.

With the foregoing in mind, FIG. 5 illustrates a flowchart of a process 110 for bias current generation based on process corners, according to an embodiment of the present disclosure. The process 110 may be implemented by the memory device 10. After manufacture of a semiconductor device (e.g., the memory device 10), a test operation may be performed on the semiconductor device. For example, a test operation may include an input buffer operation to analyze performance of an input buffer of the semiconductor device. This test operation may be performed at time of manufacture of the memory device 10. Based on the results of the input buffer operation, a process corner for the semiconductor device may be identified (block 112). For example, the process corner may be a fast process corner, a slow process corner, or a typical process corner. Based on the identified process corner, circuitry of the semiconductor device may store an indication (block 114) that may be utilized to generate and/or adjust the bias current 68. For example, one or more electrical components, such as a fuse and/or a resistive component, one or more mode registers, any suitable circuitry, software instructions, and/or any other suitable techniques may store the indication based on the identified process corner. A mapping between the identified process corner and a desired operational status of the circuitry may be utilized to adjust the operational status of the circuitry to store the indication. For example, a slow corner or typical corner may be mapped to a melted fuse and a fast corner may be mapped to an intact fuse.

The memory device 10 may generate (block 116) a code value based on the stored indication. In some instances, the memory device 10 may analyze the fuse to determine the operational status of the fuse. For example, the memory device 10 may determine whether a resistance of the fuse exceeds a threshold resistance. As such, the memory device 10 may generate the code value corresponding to the identified process corner. For instance, the code value may be fused into the one or more fuses with each fuse used to control a control signal from the one or more control lines 90. The memory device 10 may generate (block 118) and transmit one or more control signals to the bias circuitry 56 based on the code value. The bias circuitry 56 may receive the control signals and may adjust (block 120) the bias current 68 based on the control signals. For example, the process adjustment circuitry 86 may receive the control signals and adjust the operation of one or more transistors 88. The process adjustment circuitry 86 may turn on a first subset (e.g., one, two, all) of the transistors 88 and/or may turn off a second subset (e.g., one, two, all) of the transistors 88 based on the control signals. For example, one or more of the transistors 88 may pull down charge to ground 78 and increase the bias current 68 based on the identified process corner.

Thus, the technical effects of the present disclosure include facilitating consistent input buffer operations, for example, by controlling bias current for input buffers based on a reference voltage and an identified process corner.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device, comprising:
an input buffer configured to buffer data;
circuitry configured to store an indication based on a process corner of an input buffer operation; and
biasing generation and distribution circuitry configured to generate and distribute a bias current to the input buffer based at least in part on a reference voltage and the stored indication, wherein the biasing generation and distribution circuitry comprises:
dynamic voltage bias circuitry configured to adjust the bias current; and
reference voltage tracking circuitry configured to control operation of the dynamic voltage bias circuitry based on the reference voltage and the stored indication.

2. The semiconductor device of claim 1, wherein the reference voltage tracking circuitry is configured to receive a plurality of control signals based at least in part on the reference voltage.

3. The semiconductor device of claim 2, wherein the reference voltage tracking circuitry comprises a first plurality of transistors configured to receive the plurality of control signals.

4. The semiconductor device of claim 3, wherein each transistor comprises a gate terminal configured to receive a respective control signal of the plurality of control signals.

5. The semiconductor device of claim 3, wherein the dynamic voltage bias circuitry comprises a second plurality of transistors.

6. The semiconductor device of claim 5, wherein the second plurality of transistors are coupled to a common node of the input buffer.

7. The semiconductor device of claim 6, wherein a plurality of source terminals of the second plurality of transistors are coupled to a plurality of drain terminals of the first plurality of transistors.

8. The semiconductor device of claim 3, wherein a plurality of source terminals of the first plurality of transistors are coupled to ground.

9. The semiconductor device of claim 3, wherein the reference voltage tracking circuitry is configured to receive a code to control operation of the first plurality of transistors and wherein the code comprises a plurality of bits, each bit corresponding to a respective transistor of the first plurality of transistors.

10. A semiconductor device, comprising:
an input buffer configured to buffer data;
circuitry configured to store an indication based on a process corner of an input buffer operation; and
biasing generation and distribution circuitry configured to generate and distribute a bias current to the input buffer based at least in part on a reference voltage and the stored indication, wherein the biasing generation and distribution circuitry comprises:
process bias circuitry configured to adjust the bias current; and
process adjustment circuitry configured to control operation of the process bias circuitry based at least in part on the stored indication, wherein the process adjustment circuitry comprises reference voltage tracking circuitry, and controlling operation of the process bias circuitry comprises controlling operation of the process bias circuitry based on the reference voltage and the stored indication.

11. The semiconductor device of claim 10, wherein the process adjustment circuitry is configured to receive a plurality of control signals based at least in part on the stored indication.

12. The semiconductor device of claim 11, wherein the process adjustment circuitry comprises a first plurality of transistors configured to receive the plurality of control signals.

13. The semiconductor device of claim 12, wherein each transistor comprises a gate terminal configured to receive a respective control signal of the plurality of control signals.

14. The semiconductor device of claim 12, wherein the process bias circuitry comprises a second plurality of transistors coupled to a common node of the input buffer configured to supply the bias current.

15. The semiconductor device of claim 14, wherein a plurality of source terminals of the second plurality of transistors are coupled to a plurality of drain terminals of the first plurality of transistors.

16. The semiconductor device of claim 12, wherein a plurality of source terminals of the first plurality of transistors are coupled to ground.

17. A method, comprising:
storing an indication in circuitry based at least in part on a process corner for an input buffer operation, wherein the process corner comprises at least one of a fast process corner and a slow process corner;
generating control signals based at least in part on the stored indication; and
adjusting biases for an input buffer based at least in part on the control signals.

18. The method of claim 17, wherein the biases comprise a bias current and wherein the bias current associated with the fast process corner is lower than the bias current associated with the slow process corner.

19. The method of claim 17, comprising:
identifying an operational status of the circuitry based at least in part on the process corner; and
generating the control signals based at least in part on the operational status of the circuitry.

20. The method of claim 17, wherein the circuitry comprises one or more fuses, one or more mode registers, or a combination thereof.

* * * * *